(12) United States Patent
Morishita et al.

(10) Patent No.: US 7,533,318 B2
(45) Date of Patent: May 12, 2009

(54) TEST PATTERN GENERATOR AND TEST PATTERN GENERATION METHOD FOR ONBOARD MEMORY DEVICES

(75) Inventors: Hideki Morishita, Kawasaki (JP);
Tatsuya Miyazaki, Kawasaki (JP);
Naoyuki Koike, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 533 days.

(21) Appl. No.: 11/236,487

(22) Filed: Sep. 28, 2005

(65) Prior Publication Data
US 2006/0184849 A1    Aug. 17, 2006

(30) Foreign Application Priority Data
Feb. 3, 2005    (JP) .............................. 2005-027126

(51) Int. Cl.
*G06F 11/00* (2006.01)
(52) U.S. Cl. ...................................... 714/738
(58) Field of Classification Search ........................ None
See application file for complete search history.

(56) References Cited
U.S. PATENT DOCUMENTS 4,608,690 A * 8/1986 Judge .......................... 714/719

| | | | | |
|---|---|---|---|---|
| 6,195,771 B1 * | 2/2001 | Tanabe et al. | ................ | 714/718 |
| 6,421,286 B1 * | 7/2002 | Ohtani et al. | ................ | 365/200 |
| 6,484,282 B1 * | 11/2002 | Tsuto | .......................... | 714/738 |
| 6,492,923 B1 * | 12/2002 | Inoue et al. | .................. | 341/120 |
| 2001/0005132 A1 * | 6/2001 | Nishikawa et al. | ........ | 324/158.1 |

FOREIGN PATENT DOCUMENTS

JP    2-38979    2/1990

* cited by examiner

*Primary Examiner*—Cynthia Britt
*Assistant Examiner*—Guerrier Merant
(74) *Attorney, Agent, or Firm*—Staas & Halsey LLP

(57) ABSTRACT

A test pattern generator generating a test pattern for performance testing of an onboard memory is provided for a device having a memory macro, a serial input interface, and a latch circuit latching the serial input signal and outputting the result to the memory macro in parallel format. This test pattern generator has an address generator generating multi-bit addresses, parallel-serial converters parallel-serial converting the multi-bit addresses generated by the address generator into a plurality of address groups, and a controller performing control to output the converted address groups serially to the device in a plurality of cycles, comparing addresses already output to the device and addresses to be output to the device, and performing control to output only address groups having cycles corresponding to differing bits through comparing to the device.

8 Claims, 5 Drawing Sheets

FIG. 3

Step : s0 s1 s2 s3 CK

```
1 : 0 0 0 0 P     A0-A3
2 : 0 0 0 0 P     A4-A7
3 : 0 0 0 0 P     A8-A11
4 : 0 0 0 0 P     A12-A15
5 : . . . . 0     W/R
6 : 1 0 0 0 P     A0-A3
```

☐ : PATTERN SUPPLIED TO DEVICE

⬜ : PATTERN SKIPPED BY CONTROLLER

```
- : 0 0 0 0 P
- : 0 0 0 0 P
- : 0 0 0 0 P
```

```
7 : . . . . 0     W/R
8 : 0 1 0 0 P     A0-A3
```

```
- : 0 0 0 0 P
- : 0 0 0 0 P
- : 0 0 0 0 P
```

```
9  : . . . . 0    W/R
10 : 1 1 0 0 P    A0-A3
```

```
- : 0 0 0 0 P
- : 0 0 0 0 P
- : 0 0 0 0 P
```

```
11 : . . . . 0    W/R
12 : 0 0 1 0 P    A0-A3
```

```
- : 0 0 0 0 P
- : 0 0 0 0 P
- : 0 0 0 0 P
```

⋮

```
33 : . . . . 0    W/R
34 : 1 1 1 1 P    A0-A3
```

```
- : 0 0 0 0 P
- : 0 0 0 0 P
- : 0 0 0 0 P
```

```
35 : . . . . 0    W/R
36 : 0 0 0 0 P    A0-A3
37 : 1 0 0 0 P    A4-A7
```

```
- : 0 0 0 0 P
- : 0 0 0 0 P
```

```
38 : . . . . 0    W/R
39 : 1 0 0 0 P    A0-A3
```

```
- : 1 0 0 0 P
- : 0 0 0 0 P
- : 0 0 0 0 P
```

⋮

TEST PATTERN GENERATOR AND TEST PATTERN GENERATION METHOD FOR ONBOARD MEMORY DEVICES

CROSS-REFERENCE TO RELATED APPLICATIONS

This application is based upon and claims the benefit of priority from the prior Japanese Patent Application No. 2005-27126, filed on Feb. 3, 2005, the entire contents of which are incorporated herein by reference.

BACKGROUND OF THE INVENTION

1. Field of the Invention

The present invention relates to a test pattern generator for devices with onboard memories, and more particularly to a test pattern generator and test pattern generation method which can shorten the testing process for devices having serial input functions and latch functions.

2. Description of the Related Art

In recent years, in addition to SRAMs and DRAMs, LSIs with onboard memory macros such as volatile memory and the like have been developed. These LSIs, in addition to the logic circuit macros having the prescribed logic functions such as the ALU and the like, also incorporate memory macros. When the number of external terminals is limited due to various restrictions to the LSI, the memory macro cannot be directly accessed externally, and performance testing of the memory macro cannot be conducted in shipment testing.

Performance testing has been proposed in which a serial input interface is provided within the LSI, and addresses and the like are supplied via the serial input interface during performance testing to avoid this inconvenience and permit performance testing of the memory macro. For example, as disclosed in Japanese Patent Application Laid-open No. H2-38979 (Patent Document 1).

According to the Patent Document 1, a serial input interface, and a serial-parallel conversion circuit are provided in the onboard memory in devices which can be accessed only via peripheral logic circuits, and multi-bit signals such as addresses and the like are supplied to the internal memory macro by serial input and converted to parallel signals internally.

SUMMARY OF THE INVENTION

However, there is a problem in that, in conventional devices, multi-bit addresses and the like must be serially input, and the number of steps in performance testing of the onboard memory macro is considerable, thus reducing throughput of performance testing.

An object of the present invention is to provide a test pattern generator and test pattern generation method able to reduce the number of steps in performance testing of onboard memory.

To achieve the object, in the first aspect of the present invention, a test pattern generator generating a test pattern for performance testing of an onboard memory is provided for a device having a memory macro, a serial input interface, and a latch circuit latching the serial input signal and outputting the result to the memory macro in parallel format. This test pattern generator has an address generator generating multi-bit addresses, parallel-serial converters parallel-serial converting the multi-bit addresses generated by the address generator into a plurality of address groups, and a controller performing control to output the converted address groups serially to the device in a plurality of cycles, comparing addresses already output to the device and addresses to be output to the device, and performing control to output only address groups having cycles corresponding to differing bits through comparing to the device.

In the first aspect, according to a more desirable embodiment, an identification signal generator is provided to generate an identification signal identifying the cycle for output address groups, and the controller outputs the identification signal together with the address output to the device.

According to the aspect of the afore-mentioned invention, the test pattern generator parallel-serial converts multi-bit addresses, supplies these addresses serially to a device in a plurality of cycles, and provides control to output to the device only addresses having cycles corresponding to bits within already output addresses which differ from addresses to be output. Memory performance testing is a testing process in which, for example, an address is changed from address 0 to the highest address, or from the highest address to address 0 while writing and reading to each address. When incrementing or decrementing addresses in this manner, it is not always necessary for all bits in the new address to be changed from the previously output address. Thus, in the present invention, by outputting only addresses having cycles corresponding to bits differing from already output addresses, the number of steps in supplying addresses to the tested device can be reduced. Since a function to latch addresses input in a plurality of cycles is provided in the onboard memory device, the test pattern generator need only supply the cycle identification signal and the address having the necessary cycle to the device.

BRIEF DESCRIPTION OF THE DRAWINGS

FIG. 3 is a diagram describing test pattern generation with the test pattern generator 10 in the present embodiment;

DESCRIPTION OF THE PREFERRED EMBODIMENTS

The embodiments of the present invention are descried below in reference to the figures. The technical scope of the present invention is not restricted to these embodiments, and extends to the points disclosed in the claims, and to equivalents.

Figure 1:
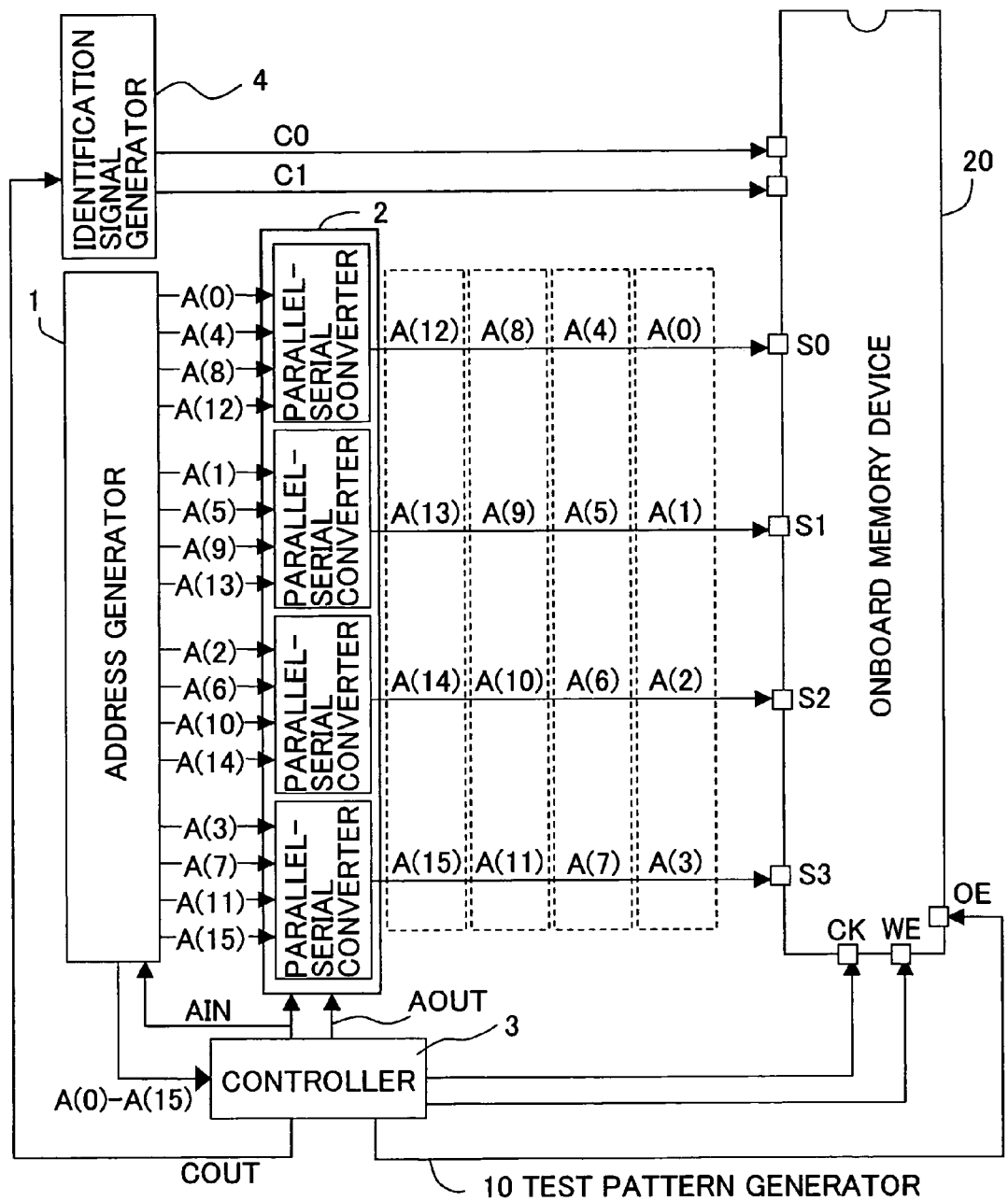
FIG. 1 is a configuration diagram of the test pattern generator of the present embodiment.

FIG. 1 is a configuration diagram of the test pattern generator of the present embodiment. The test pattern generator 10 supplies a 16-bit address in four cycles via the I/O terminals S0 through S3 to the device 20 having an onboard memory. After supplying the address, the write enable signal WE instructing write, or the output enable signal OE instructing read, is supplied, so that the desired operation is instructed to the onboard memory.

The test pattern generator 10 has an address generator 1 generating addresses for performance testing. The address generator 1 sequentially increments the 16-bit address from the lowest to the highest address, or sequentially decrements it from the highest address to the lowest address, for performance testing. The 16-bit address signal A (0) through A (15) generated by the address generator 1 is supplied to a parallel-serial converter 2 having four parallel-serial converters. The parallel-serial converter 2 parallel-serial converts the 16-bit address signal A (0) through A (15) into four groups of 4-bit units A (0) through A (3), A (4) through A (7), A (8) through A (11), and A (12) through A (15). The controller 3 outputs the four groups of 4-bit units serially to the four I/O terminals S0 through S3 of the onboard memory device 20 in synchronization with the clock CK.

The test pattern generator 10 also has an identification signal generator 4 generating the identification signals C0 and C1 identifying the address cycles. When the controller 3 causes the parallel-serial converter 2 to output the 4-bit unit addresses, it simultaneously causes the identification signal generator 4 to output the identification signals C0 and C1 indicating the address cycle.

The address generator 1 supplies the 16-bit address to the parallel-serial converter 2 and the controller 3 in response to the address input instruction signal AIN from the controller 3. Furthermore, the parallel-serial converter 2 outputs the 4-bit addresses to the device 20 in response to the address output instruction signal AOUT from the controller. Furthermore, the identification signal generator 4 outputs the identification signals C0 and C1 indicating the corresponding cycles in response to the identification signal output instruction signal COUT.

The four groups of addresses are output serially in sequence from the least significant bit group A (0) through A (3) to the most significant bit group A (12) through A (15), together with the corresponding identification signals C0 and C1 in sequence. Or output serially in sequence from the most significant bit group A (12) through A (15) to the least significant bit group A (0) through A (3), together with the corresponding identification signals C0 and C1 in sequence.

After the 16-bit address is output in a plurality of cycles, the controller 3 halts the clock CK, and sets the write enable signal WE or the output enable signal OE to the active state to instruct writing or reading of the onboard memory. The onboard memory device 20 recognizes that the address cycle has been terminated by the halted clock CK.

In order to reduce the 16-bit address supply cycle, the controller 3 also stores the address A (0) through A (15) generated by the address generator 1, compares the address already output to the onboard memory device 20 and the address to be output, and controls the parallel-serial converter 2 so that only 4-bit addresses among addresses to be output, and having cycles corresponding to addresses differing from already output addresses, are output to the device 20. Simultaneously, the controller 3 outputs the identification signals C0 and C1 identifying cycles of the 4-bit addresses output to the device 20 from the identification signal generator 4.

Actual operation of the test pattern generator 10 is described below.

Figure 2:
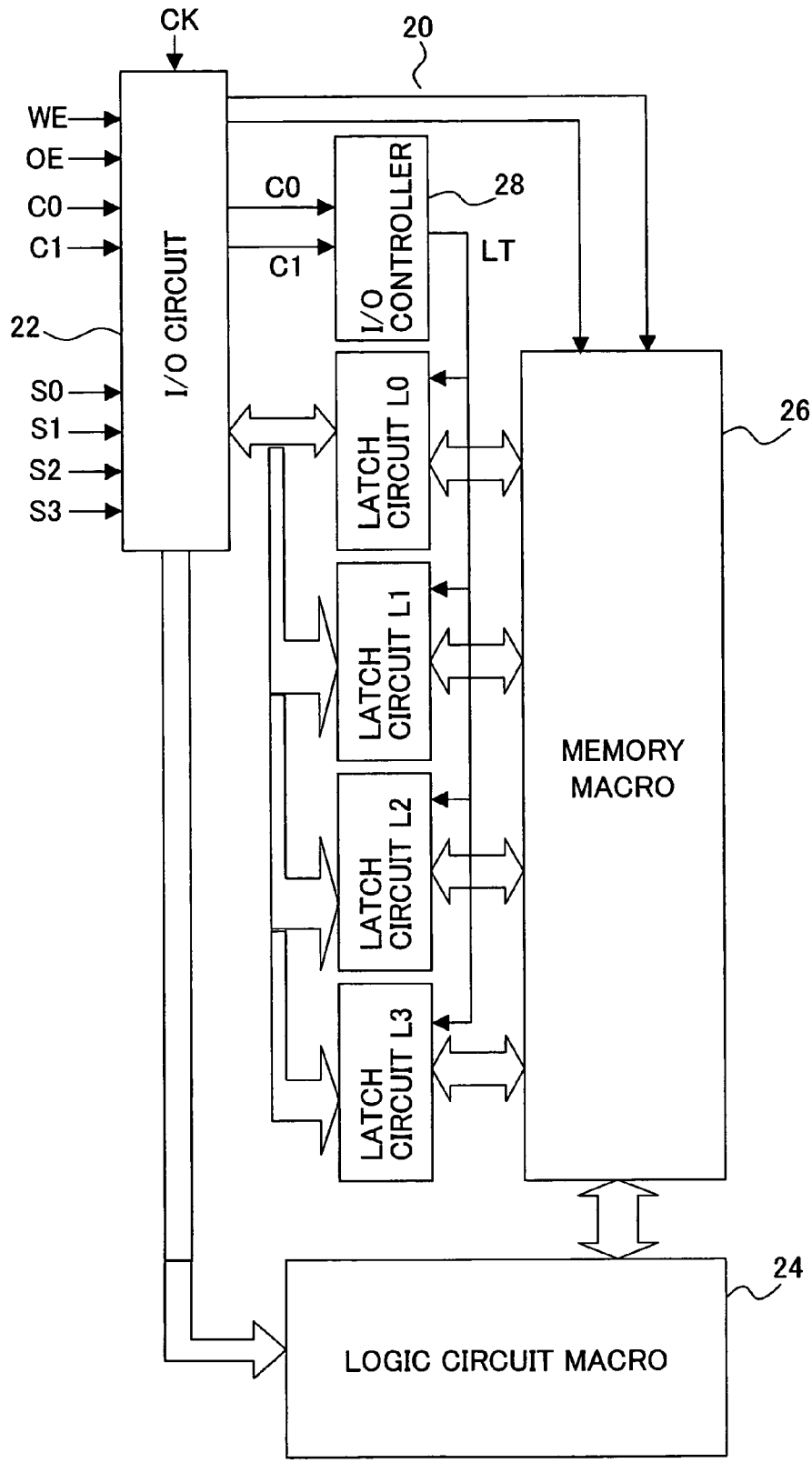
FIG. 2 is a configuration diagram of the onboard memory device in the present embodiment.

FIG. 2 is a configuration diagram of the onboard memory device in the present embodiment. The onboard memory device 20 has an internal memory macro 26, and a logic circuit macro 24. The signal input to the I/O circuit 22 is supplied to the logic circuit macro 24, the prescribed logic processing is conducted in the logic circuit macro 24, and the result is output from the I/O circuit 22. The logic circuit macro 24 stores data in, and reads stored data from, the onboard memory macro 26 as necessary. In normal operation, therefore, the onboard memory macro 26 is not directly written to or read from externally to the device.

On the other hand, the onboard memory device 20 has four latch circuits L0 through L3, and an I/O controller 28, to test operation of the onboard memory macro 26. The four latch circuits L0 through L3 latch the addresses supplied to the I/O terminals S0 through S3 in 4-bit address units corresponding to the identification signals C0 and C1. In other words, one latch circuit corresponding to the cycle specified by the identification signals C0 and C1 latches the supplied 4-bit unit address. The identification signals C0 and C1 are supplied to the I/O controller 28, and the I/O controller 28 supplies the latch instruction signal LT to the latch circuit corresponding to the identification signals, and the I/O circuit 22 latches the input 4-bit address.

After the 16-bit address is latched by the four latch circuits L0 through L3, the memory 26 inputs the latched 16-bit address in response to the write enable signal WE, and writes the data input later via the latch circuit L0 and the like. Or, the memory 26 inputs the latched 16-bit address in response to the output enable signal OE, and outputs the read data to the latch circuit L0 and the like.

FIG. 3 is a diagram describing test pattern generation with the test pattern generator 10 in the present embodiment. This example shows write and read operation while the address is incremented from address 0 to the highest address. FIG. 3 shows the address in 4-bit units and the clock CK output by the test pattern generator 10, for each generation step number.

In steps 1 through 4 at top-left, the 16-bit address at address '0' (all bits '0') is serially output in the four groups of 4-bit unit addresses A (0) through A (3), A (4) through A (7), A (8) through A (11), and A (12) through A (15). Since the address is serially output in synchronization with the clock CK, the clock CK is in the active state 'P' in steps 1 through 4. In step 5, the clock CK is halted as '0', and write or read operation is executed by the memory within the device during this interval. This operation instruction is conducted with the instruction signals WE and OE. Next, the address at address '1' is output, however in comparison with the previously output address for which all bits are '0', only the least significant 4-bit address A (0) through A (3) differs in being '0001', and thus the address A (0) through A (3) is output while setting the clock CK in the active state 'P' in step 6. However, since the other three groups of 4-bit addresses A (4) through A (7), A (8) through A (11), and A (12) through A (15) are the same as the already output address, they are not output as shown by enclosure within the dashed line in the figure. Thus, the supply of address is completed in a single cycle. In step 7, the clock CK is halted as '0', and write or read operation is executed by the memory during this interval.

Subsequent operation is similar. In order to output the address at address '2', only the least significant address A (0) through A (3)=0010 is output in step 8, and output of other addresses is omitted. Write and read operation is then conducted in step 9. Steps 10, 11, 34, and 35 are similar. Since the least significant address A (0) through A (3)=1111 in step 34, in order to input address '16' in steps 36 and 37, the least significant two group addresses A (0) through A (3)=0000 and A (4) through A (7)=0001 are serially output. Write and read operation are then conducted in step 38, and only the least significant address A (0) through A (3)=0001 is output in step 39.

As described above, when an address is incremented or decremented, the already output address often differs partially from the address to be output, and thus, in such cases, outputting only the differing address can reduce the number of serial output cycles for addresses. Thus, the test process can be shortened. Furthermore, even when the address is varied randomly, it is unusual that all 16 bits of the address differ, and similarly, the number of address cycles can be reduced.

Figure 4:
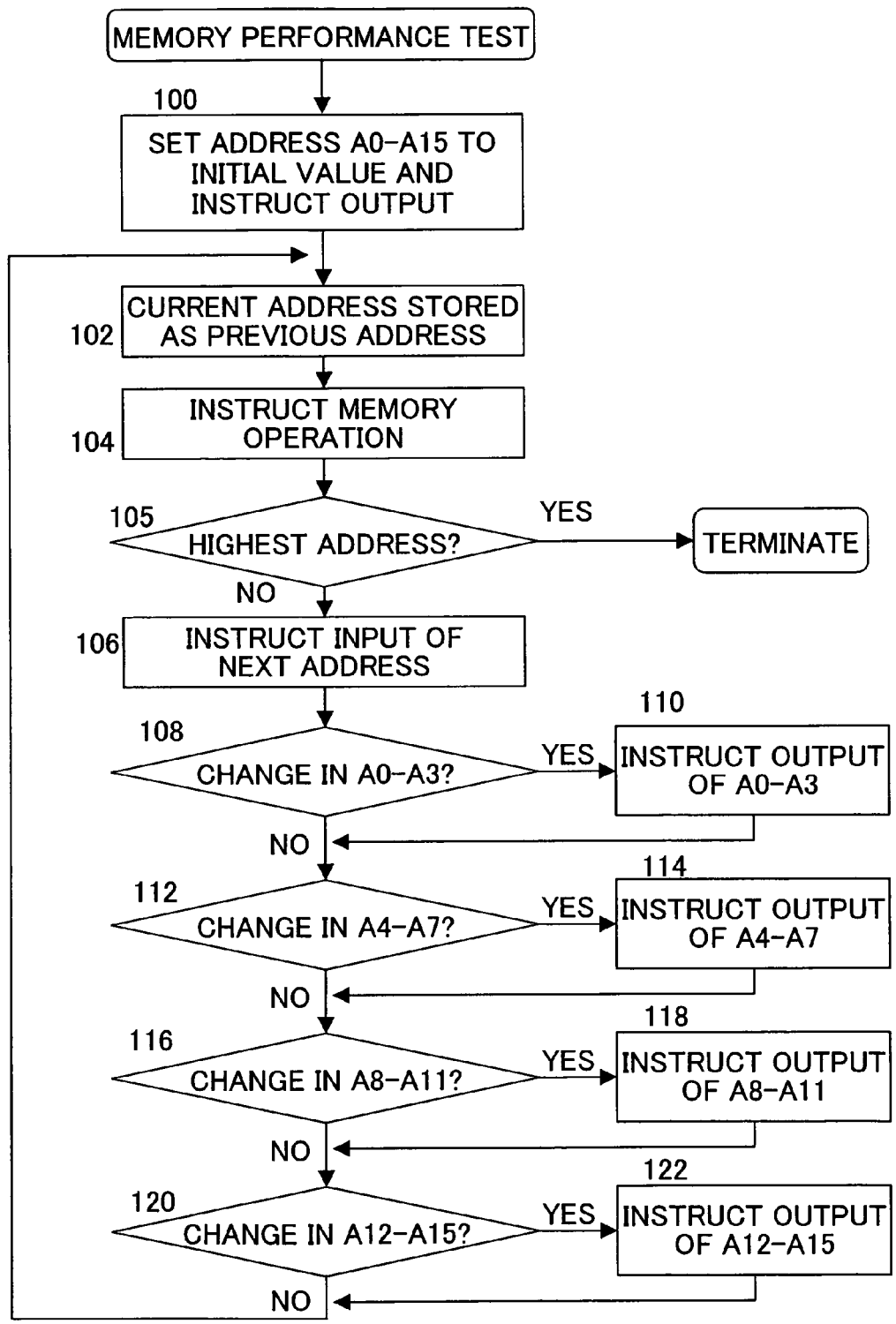
FIG. 4 is a flowchart of operation of the controller 3 of the test pattern generator 10 in the present embodiment.

FIG. 4 is a flowchart of operation of the controller 3 of the test pattern generator 10 in the present embodiment. This flowchart shows test pattern generation of address signal for test operation in which write and read operation is repeated while incrementing from the lowest to the highest address. When performance testing of the memory is commenced, the address generator 1 sets the 16-bit address A (0) through A (15) to the initial value '0' (100). The address A (0) through A (15) is output to the parallel-serial converter 2 and the controller 3 in response to the address input control signal AIN from controller.

The parallel-serial converter 2 converts each 4-bit address signal from parallel to serial, and outputs the 4-bit unit addresses serially to the onboard memory device 20 in synchronization with the clock CK in response to the output instruction, the address output instruction signal AOUT from the controller 3. In this case, the identification signal generator 4 generates the 2-bit identification signals C0 and C1 identifying the serially output cycle in response to the identification signal output instruction signal COUT from the controller, and outputs these signals C0 and C1 to the onboard memory device 20 in synchronization with the clock CK and supply of the 4-bit unit addresses. As described above, the serially supplied address is latched in the onboard memory device 20.

On the other hand, the controller 3 stores the 16-bit address (102) supplied from the address generator 1. The controller 3 then outputs the write control signal WE or the read control signal OE as the operation instruction (104). The onboard memory then conducts write or read operation corresponding to the 16-bit latched address in response to the write control signal WE or the read control signal OE from the controller 3.

When write control or read control is terminated, the controller 3 outputs the input instruction AIN for the next address (106). The address generator 1 supplies the incremented 16-bit address to the parallel-serial converter 2 and controller 3 in response to this instruction.

The controller 3 compares the previous address already output and the next address to be output, and instructs output of only the differing portion of the address. In practice, the controller 3 compares, in 4-bit units, the previous address already output and the next address to be output (108, 112, 116, 129), generates the output instruction signals AOUT and COUT for the 4-bit unit addresses A (0) through A (3), A (4) through A (7), A (8) through A (11), and A (12) through A (15) only if a change has occurred, and causes the parallel-serial converter 2 to output the address, and causes the identification signal generator 4 to output the identification signal, in synchronization with the clock CK.

The address output control and memory operation control are repeated until the highest address is reached (105). As described above, of the addresses to be output, portions matching already output addresses are not output from the parallel-serial converter 2, and only addresses with differing portions are output. There is therefore no longer any need to output all 16-bit address in four cycles, and the number of steps in the memory performance testing process can be significantly reduced.

Figure 5:
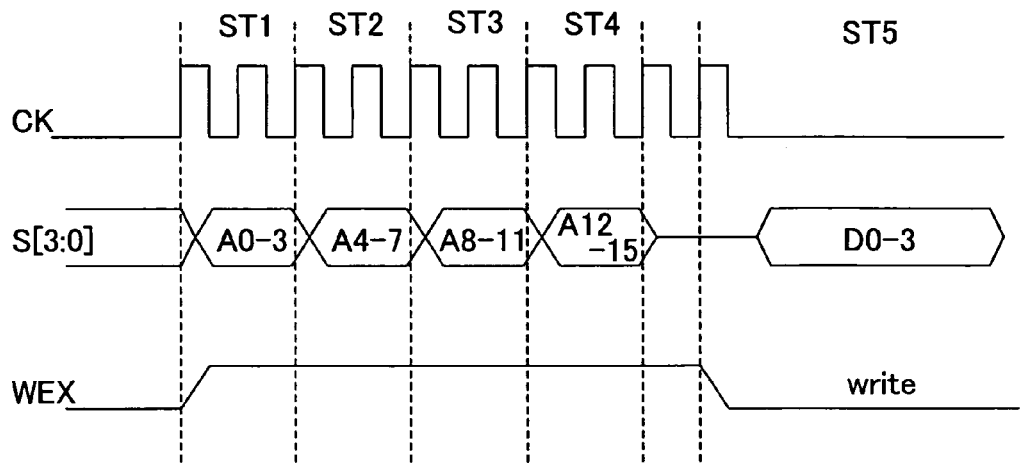
FIG. 5 is a waveform diagram showing an example of operation of the test pattern generator 10 in the present embodiment.
Figure 5:
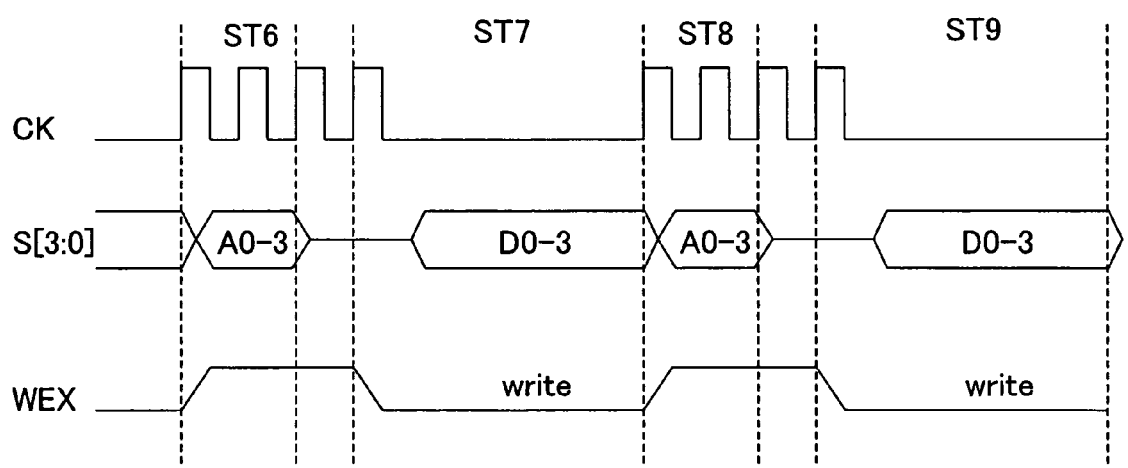
Figure 5:
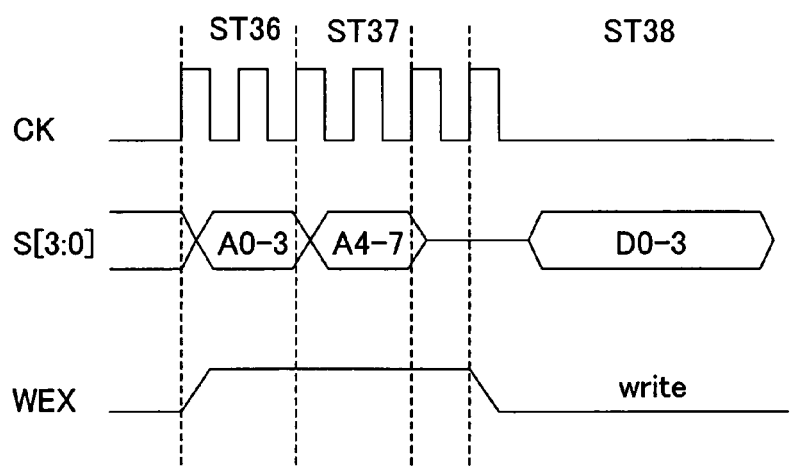

FIG. 5 is a waveform diagram showing an example of operation of the test pattern generator 10 in the present embodiment. This example also shows waveforms during performance testing in which write and read operation is repeated while incrementing from the lowest to the highest address.

Immediately after commencing testing, the initial value of the 16-bit address (all bits '0') is output to the onboard memory device 20 in four cycles. In other words, the address A (0) through A (3) is output in cycle ST1 in synchronization with the rising edge of the clock CK, followed by addresses A (4) through A (7), A (8) through A (11), and A (12) through A (15) similarly output in cycles ST2, ST3, and ST4 respectively and in synchronization with the clock CK. In this case, the identification signals C0 and C1 are also output in synchronization with the clock CK. After one cycle of the clock CK following the cycle ST4, output of the clock CK is halted at cycle ST5, and the onboard memory device 20 is notified of termination of the address cycle. Furthermore, the controller 3 sets the write enable signal WEX to 'L' (active state), and conducts write control for the onboard memory. Data to be written is supplied to the 4-bit I/O terminals S0 through S3 in cycle ST5 during this write control. A description of the supply of the write data is omitted.

Next, an address '0000000000000001' in which the initial value is incremented is generated by the address generator 1 and output to the parallel-serial converter 2. However, the controller 3 compares the address already output and the address to be output, and outputs only the least significant address A (0) through A (3) being the differing portion to the onboard memory device 20 in cycle ST6. In other words, supply of the address is completed in one cycle rather than in four cycles. Subsequently, the controller 3 sets the write enable signal WEX to 'L', instructs writing of data to the onboard memory, and supplies the 4-bit write data D0 through D3 to the I/O terminals of the device.

Similarly, a further incremented address '0000000000000010' is generated by the address generator address generator 1, and output to the parallel-serial converter 2. The controller 3 compares the addresses and supplies only the least significant address A (0) through A (3) to the onboard memory device 20 in cycle ST8. Write control is then conducted in cycle ST9.

When write operation for the address '0000000000001111' is completed at or before cycle ST35 as described above, the next incremented address '0000000000010000' is generated by the address generator 1. In this case, the controller 3 outputs only the least significant address A (0) through A (3) and the next address A (4) through A (7) to the onboard memory device 20 in cycles ST36 and ST37. Write control is then conducted in cycle ST38. Subsequently, as described above, only the differing address units within the incremented address are supplied to the onboard memory device 20.

Although not shown in FIG. 5, the controller 3 causes the identification signal generator 4 to output the identification signals C0 and C1 corresponding to the address cycle to be output. For example, the identification signals C0 and C1='00', '01', '10', and '11' are each output in cycles ST1, ST2, ST3, and ST4 respectively. Furthermore, the identification signal '00' is output in cycles ST6 and ST8, and the identification signals '00' and '01' are output in cycles ST36 and ST37 respectively. Thus, the onboard memory device 20 can identify the addresses supplied to the I/O terminals S0 through S3, and can latch these addresses in the corresponding latch circuits.

Incrementing of addresses has been described in the aforementioned embodiment, however, when decrementing addresses, and when changing addresses according to a desired pattern, the controller of the test pattern generator 10 causes only differing addresses to be output, and thus the conventional output process in which four cycles are required can be reduced to fewer cycles.

What is claimed is:

1. A test pattern generator for generating test patterns for performance testing of memory macro in a device having a memory macro, a serial input interface, and a latch circuit latching serially input signals and outputting the input signals in parallel format to the memory macro, the test pattern generator comprising:

an address generator generating multi-bit addresses;

a parallel-serial converter parallel-serial converting the multi-bit addresses generated by the address generator to a plurality of address groups; and a controller which controls the parallel-serial converter so that the converted address groups are output to the device serially in a plurality of cycles, wherein said controller compares an address already output to the device and an address to be output to the device, and controls the parallel-serial converter so that only address group having a different address bit from the address already output to the device is output to the device as the address to be output.

2. The test pattern generator according to claim 1, further comprising;

an identification signal generator generating identification signals identifying the cycle corresponding to the address groups to be output;

wherein the controller controls so that the address group is output, and the identification signals corresponding to the output address group is output, to the device.

3. The test pattern generator according to claim 1 wherein the controller controls so that the plurality of address groups are serially output from the least significant bit to the most significant bit, or from the most significant bit to the least significant bit.

4. The test pattern generator according to claim 1 wherein the controller supplies a memory macro operation instruction signal to the device after the address has been output to the device, and causes the memory macro to conduct an operation corresponding to the memory macro operation instruction signal for the supplied address.

5. The test pattern generator according to claim 1 wherein the controller causes output of the address group in synchronization with a clock supplied to the device, and halts output of the clock when output of the address group is complete.

6. A test pattern generation method for generating test patterns for performance testing of memory macro for a device having a memory macro, a serial input interface, and a latch circuit latching serially input signals and outputting the input signals in parallel format to the memory macro, the test pattern generation method comprising:

generating multi-bit addresses;

parallel-serial converting the generated multi-bit addresses to a plurality of address groups;

outputting the converted address groups to the device serially in a plurality of cycles; and when outputting the address groups, comparing an address already output to the device and an address to be output to the device, and outputting only address group having a different address bit from the address already output to the device to the device as the address to be output.

7. The test pattern generation method according to claim 6 wherein, when outputting the address groups, identification signals identifying the cycle corresponding to the address groups to be output is output to the device together with the address groups.

8. A test pattern generation method for generating test patterns for performance testing of a memory macro of a device, comprising:

generating multi-bit addresses;

converting the multi-bit addresses to a plurality of address groups;

outputting the address groups to the device serially in a plurality of cycles;

comparing an address bit of each address group to be output to the device to an address bit of each address group already output to the device, and outputting an address group only if the address bit of the address group is different from the address bit of each address group already output to the device.

* * * * *

UNITED STATES PATENT AND TRADEMARK OFFICE
CERTIFICATE OF CORRECTION

| | |
|---|---|
| PATENT NO. | : 7,533,318 B2 |
| APPLICATION NO. | : 11/236487 |
| DATED | : May 12, 2009 |
| INVENTOR(S) | : Hideki Morishita et al. |

It is certified that error appears in the above-identified patent and that said Letters Patent is hereby corrected as shown below:

Column 7, Line 21, change "signals" to --signal--.

Column 7, Line 22, change "groups" to --group--.

Column 7, Line 24, change "signals" to --signal--.

Column 8, Lines 17-18, change "to the device to the device" to --to the device is output to the device--.

Column 8, Line 21, change "signals" to --signal--.

Column 8, Line 22, change "groups" to --group--.

Column 8, Line 23, change "groups." to --group.--.

Signed and Sealed this

Eighth Day of September, 2009

David J. Kappos
*Director of the United States Patent and Trademark Office*